United States Patent [19]  [11] 4,023,197
Magdo et al.  [45] May 10, 1977

[54] INTEGRATED CIRCUIT CHIP CARRIER AND METHOD FOR FORMING THE SAME

[75] Inventors: Ingrid E. Magdo; Steven Magdo, both of Hopewell Junction, N.Y.

[73] Assignee: IBM Corporation, Armonk, N.Y.

[22] Filed: June 25, 1975

[21] Appl. No.: 590,348

Related U.S. Application Data

[62] Division of Ser. No. 461,078, April 15, 1974, Pat. No. 3,918,148.

[52] U.S. Cl. .................................. 357/71; 357/68; 357/55; 357/52
[51] Int. Cl.² .................. H01L 23/48; H01L 29/34; H01L 29/06; H02B 1/04
[58] Field of Search ....................... 357/71, 68, 55; 317/101

[56] References Cited
UNITED STATES PATENTS

| | | | |
|---|---|---|---|
| 3,622,384 | 11/1971 | Davey et al. | 357/71 |
| 3,936,865 | 2/1976 | Robinson | 357/71 |

OTHER PUBLICATIONS
IBM, Tech. Bul., vol. 14, No. 9, Feb. 1972, Anderson et al., p. 2581.

*Primary Examiner*—Edward J. Wojciechowicz
*Attorney, Agent, or Firm*—J. B. Kraft

[57] ABSTRACT

An integrated circuit chip carrier with multi-level metallurgy, in which the effects of the metallurgy in causing elevation irregularities at the various levels of the structure are minimized, is produced by a method wherein a first plurality of levels of metallization patterns respectively separated by layers of dielectric material are first formed on a planar primary layer supported on a temporary substrate having a chemical etchability different from that of the layer. The primary layer is electrically insulative with respect to said metallization patterns. Then, a supporting layer is formed on the uppermost covering layer, after which the substrate is removed with a chemical etchant which preferentially etches the substrate away from the insulative layer. Next, an opposite plurality of levels of metallization patterns are formed on the side of the insulative layer opposite to the first formed metallization patterns. These opposite metallization patterns are also respectively separated by covering layers of dielectric material.

14 Claims, 21 Drawing Figures

INTEGRATED CIRCUIT CHIP CARRIER AND METHOD FOR FORMING THE SAME

This is a division of application Ser. No. 461,078 filed Apr. 15, 1974, now U.S. Pat. No. 3,918,148.

BACKGROUND OF INVENTION

The present invention relates to integrated circuit packages, and more particularly to an integrated circuit chip carrier to be used in such packages to support one or more large scale integrated chips and to provide the metallization for interconnecting the supported chips and for connecting the supported chips to outside structures, e.g., supporting beds in a computer which may contain other integrated circuit packages.

As the integrated circuit technology advances in large scale integration towards denser integrated circuit chips containing in the order of thousands of circuits per chip, it is necessary to provide supporting electrical packaging or chip carriers structurally compatible with such chips and compatible with the performance demands of the circuitry in such chips.

At present, the circuit densities in advanced integrated circuit chips appear to have reached a point that the traditional ceramic chip carriers appear to have reached the limits of their structural compatability with respect to such advanced integrated circuit chips. The traditional ceramic modules or carriers employ what is known as a "thick film" paste technology in which silk screen and other mechanical techniques are used to apply the module or carrier metallurgy and insulative material. Such thick film metallurgy must have lateral dimensions and spacing at least one order of magnitude greater than the integrated circuit chip metallization and contact metallurgy which is produced by "thin film" techniques involving vapor deposition and photolithographic chemical and sputter etching.

One approach in the art for maintaining the structural compatibility between the advanced integrated circuit chips and the ceramic thick film modules is the use of multi-level thick film ceramic modules in which the thick film metallization is formed in a series of interconnected planes separated by insulative ceramic material. However, in order to structurally accommodate advanced integrated circuit chips containing thousands of circuits and metallurgy linework in the order of 0.3 mils, the multi-layer ceramic substrate which is limited to metallic lines in the order of 3 mils, must utilize, for example, more than 20 levels of metallurgy in order to form the necessary interconnection for a high circuit density chip having only two or three levels of metallurgy. Such multi-layered ceramic modules are expensive to produce and relatively large in size in an art whose direction is towards increased miniaturization. In addition, such multi-layer ceramic carriers impose structural limitations on the chip in order for the chip to be structurally compatible with the ceramic carrier. Where, for example, the chips are to be mounted on the ceramic carrier by solder reflow techniques such as those described in U.S. Pat. Nos. 3,495,133; 3,548,925 or 3,392,442, the solder reflow pads on the chip must be in the order of 4 mils in heighth and about 4 mils in width. Otherwise, the difference in coefficients of thermal expansion between the multi-layer ceramic module and the semiconductor, e.g., silicon, material in the chip would create sufficient stress on the pads to fracture the joints between chip and module. As a result, the chip pad must occupy many times the amount of valuable "real estate" or chip surface area than would be otherwise required if the pad could have dimensions in the order of 0.5 mils and be produced by the standard photolithographic thin film techniques.

In addition, because of the above-mentioned differences in coefficients of thermal expansion, it is undesirable to join by solder reflow chips having dimensions on a side greater than 200 mils to the ceramic substrate.

Because of these limitations in multi-layered ceramic modules for advanced integrated circuit chips with high circuit densities, consideration has been given to the concept of "computer on a wafer" wherein all of the circuitry necessary to perform the particular computer function including all internal interconnections would be formed on a single wafer. This would make the chip carriers with their interconnection functions unnecessary. The primary shortcoming of such an approach is that because of the complexity of such a wafer structure, yields are extremely low, and consequently, great numbers of integrated circuit wafers made at great expense have to be scrapped because of the likely incidence of a defect.

While there is some indication in the art of the use of carriers for integrated circuit chips made out of the same or similar semiconductor materials as the chips, such carriers appear not to have been previously applicable for supporting the advanced integrated circuit chips having thousands of circuits. This may be in large part due to the fact that even with the use of thin film technology permitted by such semiconductor material carriers, the carrier must still have more than four levels of metallurgy in order to provide the necessary interconnection for advanced chips of high circuit density. Unfortunately, until now, with metallurgies having line widths and spacing in the order of 0.3 mils, it was structurally not practical to form multi-level thin film metallurgy having more than three levels of metallization. In structures utilizing multi-layer metallurgy formed by conventional thin film techniques, there is deposited over each level metallization pattern, the passivating or insulating layer of dielectric material. This deposition is made by conventional chemical vapor deposition or sputter deposition techniques. A line in the metallization pattern will result in a corresponding elevation in the covering dielectric layer over the metallization pattern. Then, after a subsequent level metallization pattern is deposited onto the covering layer and it, in turn, covered by an additional dielectric layer, the upper surface of the additional covering layer will display the cumulative effects of both underlying metallization patterns. The surface will display a combination of three different heights: a lowermost height where there is no underlying metallization line, an intermediate height where there is only an underlying metallization line at one metallization level and the greatest height in portions of the surface where there are underlying lines from both levels of metallization patterns. As may be seen, with three levels of metallization, the uppermost covering dielectric layer will have even a greater variety of height combinations. As previously indicated, with metallization patterns having lines in the order of 0.3 mils, the effect of these irregularities in elevation becomes so pronounced that it is impractical to try and utilize more than three levels of metallization. We have, in such cases, a "sky-scraper" effect wherein the cumulative metal lines produce pronounced elevations which render the surface so irregular that the metal lines in the pattern extend over a very bumpy surface. This leads to discontinuities in the metal lines.

Because of these irregularities, in structures with more than three levels of metallization, the interconnection of subsequent levels to underlying levels by means of via holes becomes quite unpredictable and inconsistent. In addition, even in structure having three levels of metallization, it is not consistently possible to design a structure wherein a via hole through a given covering layer of dielectric material can be so positioned as to coincide with or overlap an underlying via hole through a lower dielectric layer.

SUMMARY OF THE INVENTION

Accordingly, it is a primary object of the present invention to provide a carrier for advanced integrated circuit chips of high circuit densities which is structurally compatible with such chips.

It is another object of the present invention to provide a carrier for advanced integrated circuit chips of high circuit densities which is relatively compact, and utilizes a minimum of metallization levels.

It is yet another object of the present invention to provide a carrier for advanced integrated circuit chips of high circuit densities which utilizes multi-levels of thin film metallization and thin film insulation.

It is still another object of the present invention to provide a carrier for advanced integrated circuit chips of high circuit densities which has substantially the same coefficient of thermal expansion as the chips.

It is a further object of the present invention to provide a carrier for advanced integrated circuit chips of high circuit densities which is structurally compatible with chips having solder reflow type pads formed by thin film techniques.

It is even a further object of the present invention to provide a carrier for advanced integrated circuit chips of high circuit densities which is structurally compatible and may be joined to chips having large dimensions in excess of 200 mils per side.

It is still a further object of the present invention to provide a carrier for advanced integrated circuit chips of high circuit densities which has substantially the same coefficient of thermal expansion as the chips and has a multi-level thin film metallization pattern having more than three levels of metallization.

It is an additional object of the present invention to provide a method for forming multi-level thin film metallization structures wherein the cumulative effects of the metallization line introducing elevation irregularities in covering dielectric layers is minimized.

It is even an additional object of the present invention to provide a method for forming thin film multi-level metallization carriers for advanced integrated circuits chips of high circuit densities which have more than three levels of metallization and in which the effects of the various levels of metallization to produce irregularities in the dielectric layers is minimized.

It is still an additional object of the present invention to provide a method for forming multi-level thin film metallurgy structures having coincident or overlapping via holes through two different levels of dielectric layers.

The present invention provides a method for forming a structure having multi-level metallization, particularly useful in forming multi-level metallization by thin film techniques, which substantially reduces the effects of the lines in the several metallization levels in producing undesirable elevation in the insulative layers of the structure. In effect, the present invention reduces the overall undesirable elevation in half. Thus, it becomes practical to produce multi-level metallization structures having six and even more levels of metallization. As a result, it is now feasible, by the method of the present invention, to produce chip carriers by thin film processing techniques which are structurally compatible with high circuit density large scale integrated circuit chips. Accordingly, the present invention provides a thin film chip carrier which offers an advantageous alternative to the more conventional thick film-ceramic type chip carriers which have structural limitations as described hereinabove.

In accordance with the method of the present invention, there is formed on a substrate a primary layer which has a chemical etchability different from that of the substrate and is electrically insulative with respect to subsequently applied metallization patterns. The substrate is a temporary substrate and will be subsequently removed by chemical etching. Where the substrate is preferably a semiconductor material, particularly silicon, the primary layer may be silicon dioxide since silicon may be selectively etched away from silicon dioxide by conventional etchants such as nitric acid-hydrofluoric acid solutions. On the other hand, if electrochemical anodic etching is to be used to remove the substrate, then, it is preferable to either form the primary layer of silicon nitride or to use a composite structure for the primary layer having a layer of metal which is not anodically etchable at the silicon interface and a silicon dioxide layer on the metal layer to provide the electrically insulative property.

Next, a first level metallization pattern is formed on the exposed (non-interface) surface of the primary layer; this metallization pattern may be formed by conventional thin film photolithographic etching techniques.

Next, a first covering layer of dielectric material is formed over said metallization pattern utilizing chemical vapor deposition or sputtering techniques. The dielectric material may conveniently be the same material used in the primary layer.

Next, there is formed on said first covering layer one or more additional levels of metallization patterns. Each of these additional metallization patterns has a corresponding additional covering layer of dielectric material.

Then, a supporting base is formed on the last formed additional covering layer. The material of the supporting base is preferably one which has a thermal coefficient of expansion close to that of the dielectric material forming the primary and covering layers. A semiconductor material, particularly silicon, provides a suitable supporting base. When a semiconductor material such as silicon is used, it is conveniently epitaxially deposited to provide a polycrystalline silicon layer as the base.

Now that the supporting base is formed, the temporary substrate is removed by a chemical etching process wherein the substrate is preferentially etched away to expose the other surface of the primary layer. As mentioned above, the chemical etching process may be one with a standard chemical etchant or it may involve electrochemical, e.g., anodic etching.

Next, the process of forming a plurality of levels of metallization patterns is repeated on the exposed or other surface of the primary layer. First, an opposite level metallization pattern is formed on the other surface of the primary layer. Again, this may be formed by depositing a thin film of metal followed by conventional collective photolithographic etching. Alternatively, if the primary layer is a composite of a dielectric layer and a metal layer, as previously described, an initial metal layer need not be deposited. Rather, the metal layer of the composite may be photolithographically etched to provide the bottom opposite level metallization pattern. Then, an opposite covering layer of dielectric material is deposited over the opposite metallization pattern, after which additional opposite level metallization patterns, each respectively covered by an additional opposite covering layer, may be formed by the heretofore described methods.

Since the dielectric material in the primary layer has a first planar surface above which the first level metallization pattern and its additional level metallization patterns are formed, as well as an opposite planar surface, above which the opposite level metallization pattern and its additional opposite level metallization patterns are formed, the undesirable cumulative elevation effect of the lines in the several levels of metallization pattern may be reduced up to one-half. This is due to the fact that a multi-level metallization structure may be formed in which one-half of the levels of metallization are on one side of the planar primary dielectric layer and the other half of metallization pattern levels are on the other side of the planar primary layer. Since cumulative deviations in elevation occur with respect to an initial planar surface, the cumulative deviation in elevation in the present structure is only contributed to by the half of the total number of layers on a given side of the planar primary layer. In the conventional multi-layer structures where levels of metallization are all above a single planar surface, the deviation in elevation would be double that of the present structure.

The effect of this difference becomes very pronounced when one recognizes that at the present state of the thin film technology, it is impractical, because of the effects of deviations in elevation to produce more than three levels of metallization patterns where the lines and spacing are in the order of 0.3 mils. The method and the structure of the present invention now make six levels of metallization patterns in such structure practical.

The foregoing and other objects, features and advantages of the invention will be apparent from the following more particular description and preferred embodiments of the invention as illustrated in the accompanying drawings.

DESCRIPTION OF PREFERRED EMBODIMENTS

Figure 1A:
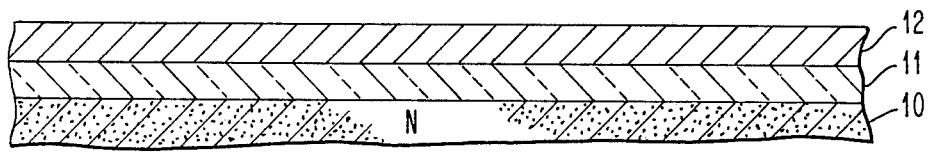
FIGS. 1A–N show diagrammatic views of a portion of an integrated circuit chip carrier in order to illustrate the method of fabricating a first embodiment of the present invention.
Figure 1B:
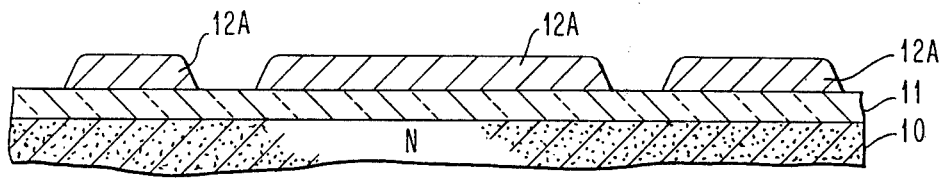
Figure 1C:
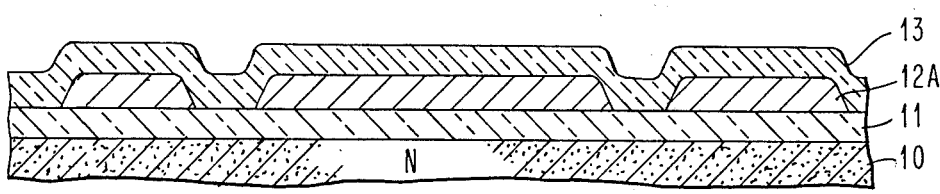
Figure 1D:
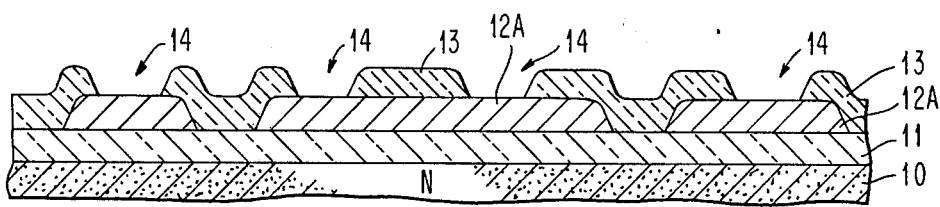
Figure 1E:
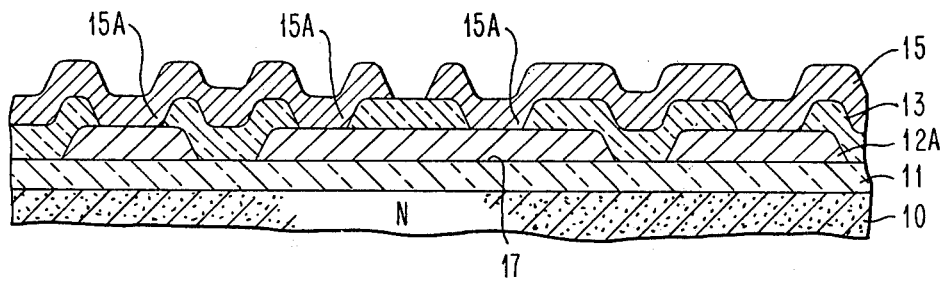
Figure 1F:
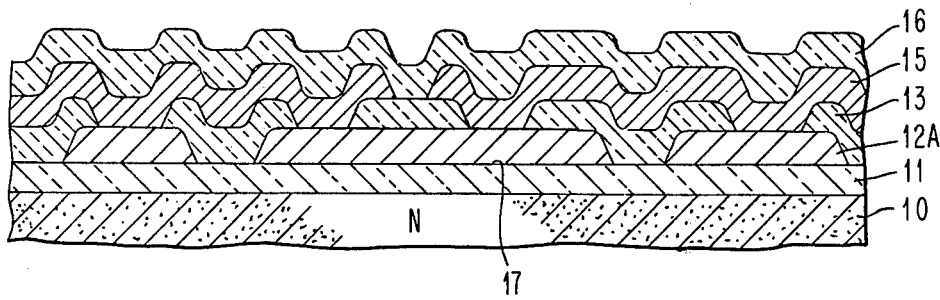
Figure 1G:
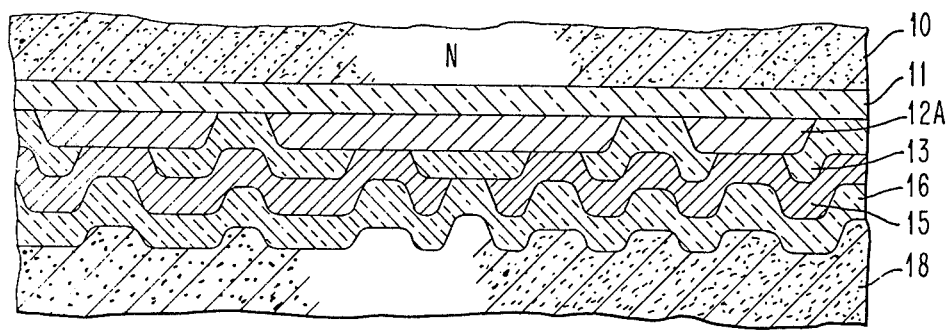
Figure 1H:
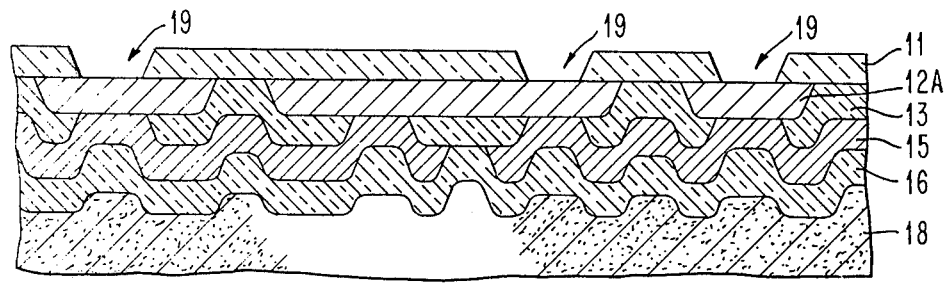
Figure 1I:
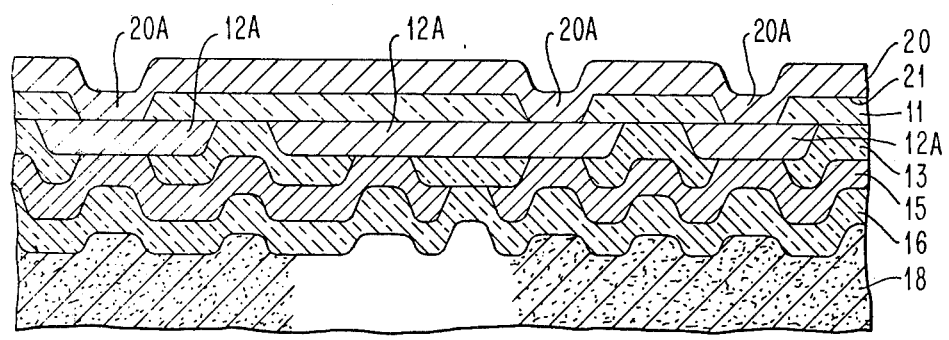
Figure 1J:
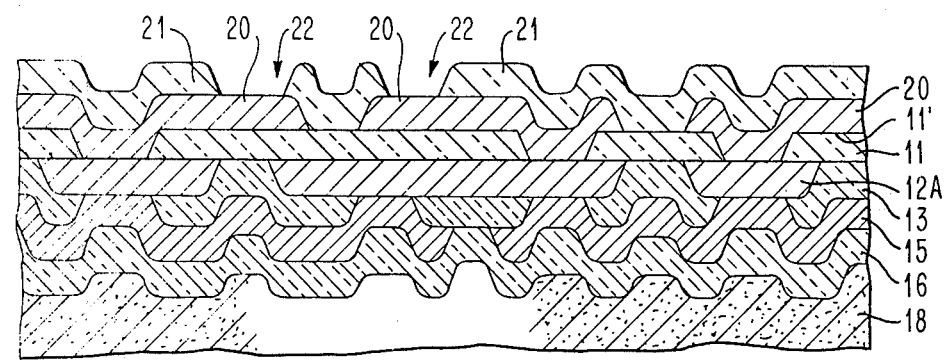
Figure 1K:
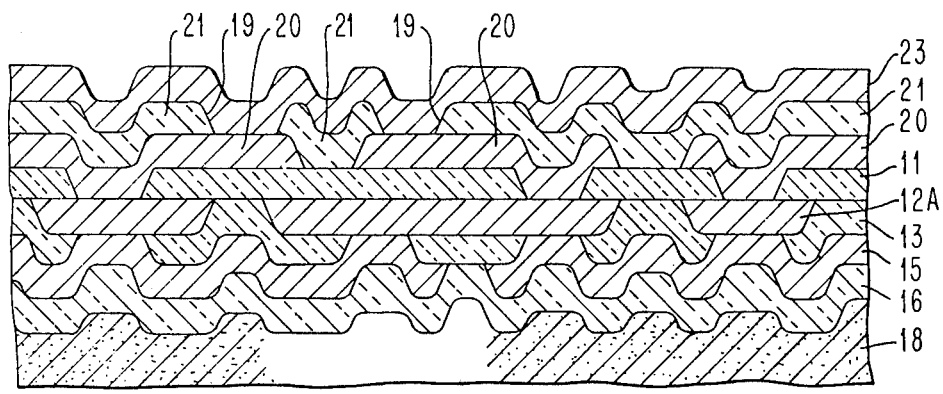
Figure 1L:
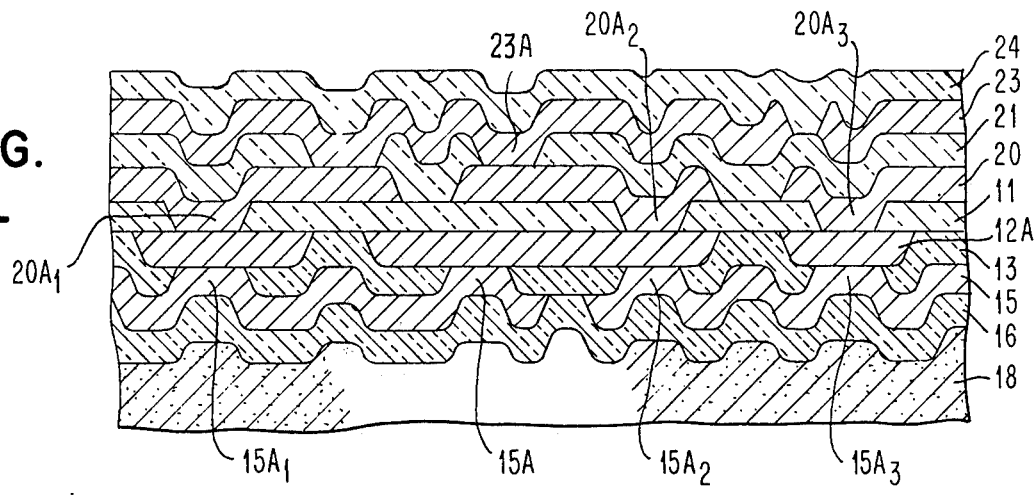
Figure 1M:
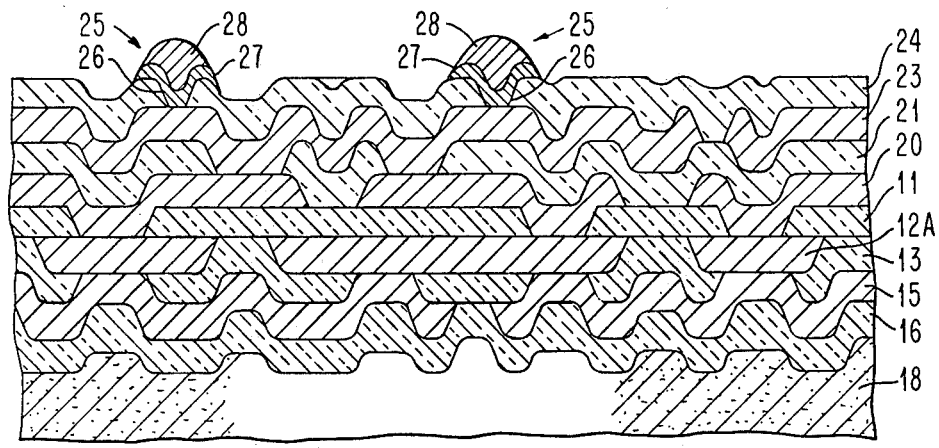
Figure 1N:
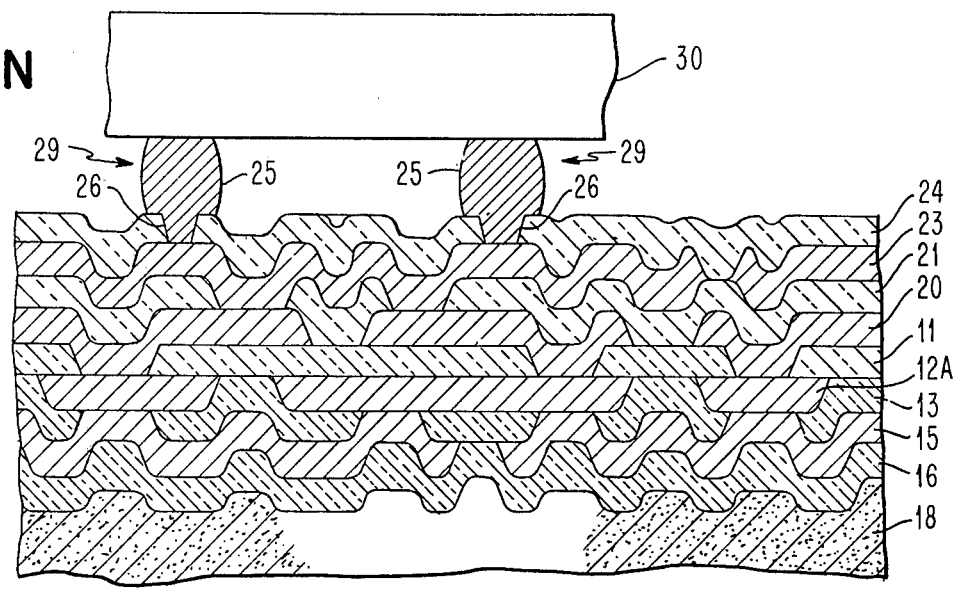

With reference to FIGS. 1A–1N, there is illustrated a primary method for fabricating the novel integrated circuit chip carrier of the present invention. On a suitable semiconductor substrate 10 which, for the present preferred embodiment, is an N type wafer 8 to 16 mils in thickness, doped with a dopant, such as arsenic or phosphorus, there is formed a layer 11 of electrically insulative material. In the first embodiment, substrate 10 is preferably silicon and layer 11 is silicon dioxide having a thickness in the order of 1 micron. A wide variety of alternative materials may be used for layers 10 and 11. The primary criterion in the selection of these materials is that substrate 10 must be preferentially etchable by some chemical expedient including electrochemical expedients so as to be removable from layer 11. Where substrate 10 is a highly doped N type or P type material, it is readily separable from insulative layer 11 by conventional preferential chemical etching with an etchant such as a dilute nitric acid-hydrofluoric acid solution as well as by electrochemical etching such as anodic etching. With such conventional chemical etching, it is not necessary for silicon substrate 10 to be highly doped in order to render it separable from insulative layer 11 of such dielectric materials as silicon nitride or silicon dioxide.

Where insulative layer 11 is silicon dioxide, it may be readily formed by thermally oxidizing the surface of substrate 10 to silicon dioxide. Of course, conventional chemical vapor deposition methods as well as cathode sputtering or RF sputtering methods may also be used to deposit dielectric materials such as silicon nitride, aluminum oxide or silicon dioxide as layer 11. Where layer 11 is silicon dioxide, it may be formed in two steps, an initial thermal portion followed by a portion deposited by either chemical vapor deposition or sputtering. A layer of metal 12 is deposited on insulative layer 11 by conventional thin film deposition techniques such as those described in U.S. Pat. No. 3,539,876. The deposition may be, for example, vapor deposition or RF sputter deposition. Metal layer 12 which has a thickness in the order of 1 to 2 microns may be any conventional metal used in integrated circuit connections. In the present embodiment, it is preferably a structure in which metallic layer is a composite of chromium, copper and chromium or, alternatively, an aluminum or an aluminum-copper alloy. Other utilizable thin film metals include refractory type metals such as tungsten, tantalum, and molybdenum or composite layers of such refractory metals and gold.

Next, FIG. 1B, utilizing conventional integrated circuit photolithographic defined etching techniques which may involved conventional chemical or sputter etching, a first level metallization pattern 12A is formed from metallic layer 12. Metallization pattern 12A will provide one level of metallic interconnections in the chip carrier.

Then, FIG. 1C, using the conventional techniques for deposition of thin film insulative layers as previously described and also described in U.S. Pat. No. 3,539,876, insulative layer 13 is deposited by preferably RF sputter deposition if the insulative material is silicon dioxide, or by chemical vapor deposition, particularly where the material is silicon nitride. Where primary insulative layer 11 is silicon dioxide, it is preferable to use silicon dioxide for layer 13. Layer 13, which serves the function of the first covering layer, preferably has a thickness in the order of 2 microns. As may be observed, layer 13 which has a substantially uniform thickness is characterized by a pattern of elevated portions corresponding to the underlying metallization pattern 12A.

Next, as shown in FIG. 1D, utilizing standard silicon dioxide photolithographic etching techniques, as described, for example, in U.S. Pat. No. 3,539,876, via holes 14 are etched through silicon dioxide covering layer 13 to the underlying metallization pattern 12A. A standard etchant which may be used is buffered HF.

Then, FIG. 1E, utilizing the previously described techniques, an additional level metallization pattern 15 is formed on covering insulative layer 13. Metallization pattern 15 which is preferably formed of the same metal as pattern 12A has a film thickness of 1.5 to 2.5 microns. During the deposition of metallization pattern 15, portions of the metallization 15A are deposited in via holes to form interlevel connections between upper metallization pattern 15 and underlying metallization pattern 12A.

As shown in FIG. 1F, an additional covering layer 16 of dielectric material, preferably silicon dioxide, is then deposited over additional metallization pattern 15 by the conventional methods described above. Layer 16 preferably has a thickness of 2 to 3 microns.

Depending on the extensiveness of the interconnections required by the chip carrier, it will be often desirable to form on additional covering layer 16 still another metallization pattern by the techniques heretofore described and still an additional covering layer over this metallization pattern. This will, in effect, provide three levels of metallization above surface 17 of primary insulative layer 11. However, for purposes of convenience of illustration in this first embodiment, this last level metallization pattern and the additional covering layer are not shown. Another structure having additional levels of metallization is shown in FIGS. 2A-G.

As shown in FIG. 1G, a relatively thick epitaxial layer 18 of silicon is deposited by conventional epitaxial deposition techniques conducted at a temperature in the order of 500° to 900° C at ambient pressures. The epitaxial thickness is preferably in the order of from 8 to 16 mils. Epitaxial layers may be formed using the apparatus and method described in U.S. Pat. No. 3,424,629. This layer will serve as the supporting layer or base of the integrated circuit chip carrier. Because underlying layer 16 is of a dielectric material, epitaxial layer 18 will be polycrystalline silicon.

At this stage, silicon layer 18, which has served the function of a temporary substrate for the carrier, should be removed. Where layer 11 is silicon dioxide, conventional chemical etching utilizing a known etchant which preferentially etches silicon with respect to silicon dioxide is used. A dilute nitric acid-hydrofluoric acid solution which accomplishes this has the following composition: 500 parts by volume 70% nitric acid, 500 parts iodine saturated nitric acid, 14 parts 40% ammonium fluoride, 2 parts 49% hydrofluoric acid and 5 parts 98% acetic acid. Where insulative layer 11 is a material such as silicon nitride, electrochemical anodic etching is preferable. In addition, in the case of silicon nitride, it is even more preferable to utilize an electrochemical etching procedure shown as anodic etching. Anodic etching is known in the art, and is described, for example, in the Journal of The Electrochemical Society, July 1970, M. Theunissen et al., pp. 959-965.

As previously mentioned, layer 11 may be a composite of two layers, with an insulative layer portion such as silicon dioxide at interface 17 and an upper layer of metal, which may be any of the previously described metals, in contact with silicon substrate 10. In such a case, the chemical etching procedure for removing silicon layer 10 will involve the utilization of an etchant which attacks silicon but does not attack the metal. Electrochemical anodic etching offers such an approach; this will be described in further detail hereinafter with respect to FIGS. 2A-2G.

After the removal of silicon support 10, via holes 19 are formed through insulative layer 11 utilizing any of the aforementioned photolithographic etching techniques, FIG. 1H. Then, FIG. 1I, utilizing the same metallurgies as well as the previously described techniques for depositing such metallurgies, opposite level metallization 20, is deposited on the exposed surface 11' of insulative layer 11. Portions of this layer 20A are deposited in via holes 19 and, thereby, from conductive pads through insulative layer 11 to first level metallization pattern 12A.

Next, FIG. 1J, utilizing the previously mentioned conventional photolithographic etching techniques, opposite level metallization 20 is etched into a metallization pattern, after which an opposite covering layer of dielectric material 21 having the same structure, thickness and composition of the previously described covering layers, is deposited by the previously described techniques. Via holes 22 are formed through covering layer 21 in the manner previously described.

Then, FIG. 1K, an additional opposite level of metallization 23 having the same thickness and composition as the previously described metallization is deposited by the previously described techniques. Portions of metallization 23 extend through via holes 19 into contact with underlying metallization pattern 20. Then, FIG. 1L, utilizing the previously described methods, metallization level 23 is formed into a metallization pattern, after which additional opposite covering layer 24 of dielectric material is deposited over the structure.

In the structure of FIG. 1L, whether a total of four levels of metallization patterns (as shown for illustrative purposes) or a structure with six or more levels of metallization is formed, as will be described in greater detail with respect to FIGS. 2A-2G, the cumulative effects of the lines in the metallization pattern on the surface of insulative layer 24 are minimized. In addition, as is relatively apparent from the structure in FIG. 1L, there are several pairs of overlapped via holes i.e., via holes which are substantially coincident in the structure. Metallization portions $20A_1$, $20A_2$ and $20A_3$ of opposite level metallization pattern 20 are in via holes respectively coincident with the via holes in which metallization portions $15A_1$, $15A_2$ and $15a_3$ of additional level metallization pattern 15 are formed. In addition, metallization portion 23A of additional opposite level metallization pattern 23 is in a via hole which overlaps the via hole in which metallization portion 15A is formed. The structure with such pairs of overlapping vias is made possible by the unique structure and method of the present invention wherein in the case of each of the pairs of overlapping vias, the two metallic portions are from metallization patterns on opposite sides of primary planar insulative layer 11. Where, in accordance with prior art methods, all via holes must be formed on only one side of a planar substrate, the cumulative effect of the underlying metallization lines and underlying via holes would make it substantially impossible to form via holes having consistent properties through an upper layer of insulation.

In such cases, the insulative layer through which the upper via hole is to be formed has such irregularities in its thickness that the danger of over-etching or under-etching in forming the via hole becomes quite pronounced. In addition, even where there are no overlapping via holes, the bumpiness of the surface makes it very difficult to photolithographically mask the insulative layer surfaces. Consequently, such insulative layers are subject to stray holes. Also, pin-hole formation becomes more pronounced. Such stray holes and pin-holes result in increased shorts between metallization patterns.

Where it is desirable to mount the integrated circuit chip on the present carrier by conventional solder reflow methods, solder reflow pads such as pads 25 may be formed on the surface of insulative layer 24 which pads are conductively connected to underlying metallization pattern 23 through via holes 26 which may be formed in the manner previously described, FIG. 1M. After the via holes are formed, pads 25 may be conveniently formed by first forming metallic layer 27 in via hole 26. Layer 27 may be a composite of two successive layers (the sub-division is not shown); first, a layer of chromium in the order of 2,000A, followed by a layer of copper about 1-2 microns in thickness. Composite layer 27 may be accomplished by any conventional metal deposition and photolithographic etching techniques such as those described in U.S. Pat. No. 3,539,876.

Since pad 25 is to be a standard lead-tin solder reflow type pad, the chrome-copper composite 27 should include a thin upper layer of gold about 500-1,000A (not shown). The gold layer on the surface of layer 27 may be formed by the standard techniques of photolithographically masking the entire surface of insulative layer 24 except for layer 27 and utilizing standard gold electroplating techniques to deposit a layer of gold having a thickness of about 500-1,000A or by the masked deposition techniques of U.S. Pat. No. 3,539,876.

Next, solder mound portions 28 of pads 25 are deposited on gold coated layers 27. These solder mounds are standard compositions and structures previously used in the art for solder reflow contacts as described in U.S. Pat. Nos. 3,495,133, 3,458,925, and 3,392,442. In these methods, advantage is taken of the property of the solder material 28 to selectively wet gold.

Next, as shown in FIG. 1N, a chip 30, a portion of which is shown, having solder reflow pads 29 which are substantially coincident with pads 25 on the carrier is placed on these pads in accordance with well established solder reflow joining techniques and the structure is heated to melt the solder forming the joint and then subsequently cooled to solidify the joint and obtain the structure shown. While, for purposes of the present illustration only, two pairs of coincident solder reflow pads are shown, it should be understood that a chip 30 with even hundreds of such pads could be joined to the present carrier in the manner shown.

With respect to FIG. 1M, pads 25 have been described as utilizable for solder reflow chip joining. It should be understood that pads 25 may be used for purposes other than attaching chips to the carrier. For example, pads 25 may be used to join the carrier to circuit boards by solder reflow joining. In this connection, in a given carrier structure, some of pads 25 may be used to join chips to the carrier and others to join the carrier to a substrate such as a circuit board.

The structure shown in FIGS. 1M or 1N is a carrier with four levels of metallization. With such a four-level structure, the use of a metallic or conductive shield is optional and depends in a large part upon the vertical and horizontal spacing between the metallization lines and the various pattern levels. However, in structures where such a conductive shield is desirable, polycrystalline silicon support 18, which is separated from the metallization by covering layer 16, may be used for this purpose. In such a case, it is necessary to sufficiently dope polycrystalline silicon support 18 to render it conductive. This may be readily accomplished by the previously described epitaxial deposition techniques for depositing polycrystalline silicon substrate 18 except that sufficient conductivity-determining impurity or dopant is added to the epitaxial system so that polycrystalline substrate 18 is doped to a level in the order of $10^{13}$. Accordingly, polycrystalline support 18 will serve as a shield and, thus, function as an electrical shield or sump for receiving stray signals produced in the lines of the metallization pattern to prevent these signals from having a pronounced effect on other lines.

Where polysilicon support 18 is doped so as to be conductive, it may also be used as a voltage distribution plane, thereby avoiding the use of one of the metallization levels for this purpose. In such a case, the structure of FIGS. 1M or 1N would be modified so as to provide some via holes (not shown) formed in the previously described manner through covering layer 16 to the underlying metallization pattern 15. These via holes would be formed through layer 16 prior to the deposition of the polycrystalline substrate 18 in step 1G, whereby the doped polycrystalline material would be also deposited in the via holes to provide the necessary conductive pads.

Where the carrier structure of the present invention has six or more layers of metallization, the structure is even more likely to require at least one and possibly more conductive shields for many purposes. The embodiment described in FIGS. 2A-2G discloses how, for example, in a carrier structure having six or more layers of metallization, a metallic shield may be incorporated into the structure. This shield may serve the previously described conductive shield function either alone or in combination with a conductive doped polycrystalline supporting layer. In addition, the embodiment to be described offers an approach wherein the metallic layer which is to serve the conductive shield function serves an additional function during the fabrication. If the metal layer is made part of the primary planar layer, the metal may form the interface of this layer with the temporary silicon substrate and thus provide an interface which is not affected by the etching process which removes the temporary silicon layer. This expedient is believed to be particularly useful when silicon is to be electrochemically separated from a primary layer of silicon dioxide by the previously mentioned anodic etching techniques.

Figure 2A:
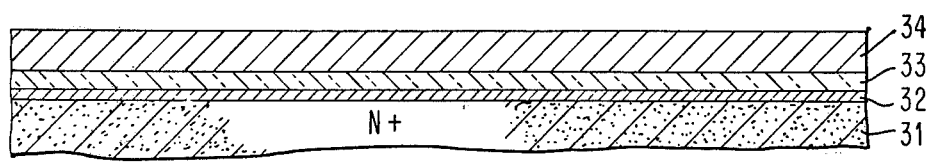
FIGS. 2A–G show diagrammatic views of a portion of an integrated circuit chip carrier in order to illustrate a method for fabricating another embodiment of the present invention.

The embodiment of FIG. 2A-2G will now be described. Since a great many of the steps in this embodiment are substantially the same as those described with respect to the embodiment of FIG. 1A-1N, specific descriptions of a particular step will be omitted when the step is the same as previously described. Referring now to FIG. 2A, on N+ type silicon substrate 31 having a thickness of 15 mils and doped with a conductivity-determining impurity concentration greater than 3 × $10^{18}$ atoms/cm³ of a dopant such as arsenic or phosphorus, there is formed metallic layer 32 of the previously described type metallization, e.g., a chromium-copper chromium or aluminum layer, having a thickness in the order of 0.5 to 1 micron, which is thinner than the thicknesses of the previously described metallization layers. A silicon dioxide layer 33 having a thickness of 1 to 2 microns is formed on metallic layer 32 by sputter or by chemical vapor deposition. A layer of metallization 34 having the same thickness, e.g., 1 micron, and the same composition of the metallization levels in the previously described embodiment is then deposited on silicon dioxide layer 33. It should be noted that silicon layer 31 may be P+. Since it is to be removed from the structure by preferential anodic etching, it is preferably heavily doped.

Figure 2B:
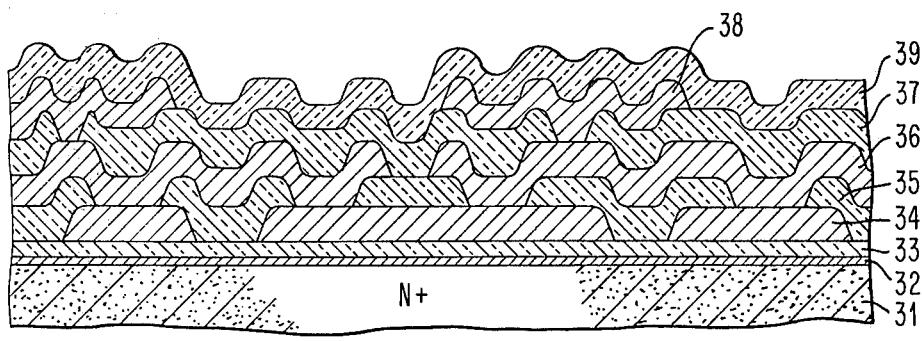

Then, as shown in FIG. 2B, metallic layer 34 is formed into the first level metallization pattern. It is covered by a first covering layer 35 of dielectric material on which there is formed an additional level metallization pattern 36 which is, in turn, covered with additional covering layer 37 of dielectric material. A third level metallization pattern 38 is formed on covering layer 37, and it, in turn, is covered by a covering layer 39 of said dielectric material. The dielectric material in the covering layer is preferably silicon dioxide.

Figure 2C:
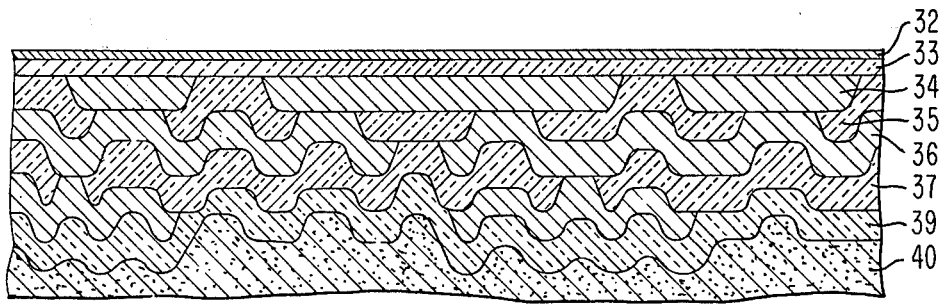

Next, FIG. 2C, utilizing the previously described epitaxial deposition techniques, a relatively thick supporting layer 40 of polycrystalline silicon, which may be doped or undoped depending on whether this support is to be conductive, is formed. Then, also as shown in FIG. 2C, silicon layer 31, which has served the function of a temporary substrate for the carrier, is removed. In this example, the N+ silicon is removed by anodic etching in accordance with the previously described method. In addition to being resistent to the anodic etching process, metallic layer 32 serves the function as an anode during the anodic etching step. The following conditions may be used: $V_{anode-cathode} =$ 10 volts; the electrolyte is a 5% aqueous HF solution; bath temperature 18° C; complete darkness; the cathode is platinum gauze; the cathode is parallel to anode 32 at a distance of about 5 centimeters. As a result of this preferential anodic etching, the silicon substrate 31 is cleanly removed, leaving metallic layer 32 exposed.

When metallic layer 32 is used as here for a barrier in the anodic etching, it may subsequently be formed into the opposite level metallization pattern which would make it the equivalent of metallization pattern 20 in the embodiment of FIG. 1I. As such, it could be used in the conductive interconnection function of the chip carrier. In such a case, it would be desirable for metallic layer 32 to have approximately the same thickness of the layers forming the various metallization patterns. However, in accordance with the present embodiment, metallic layer 32 is considerably thinner than the layers forming the various metallization patterns and will be used primarily to fulfill the previously described conductive shield function, i.e., it will provide a metallic shield centrally located between the already formed three levels of metallization patterns on one side of the planar silicon dioxide layer 33 and the three levels of metallization patterns on the other side of silicon dioxide layer 33 which are to be subsequently formed.

Figure 2D:
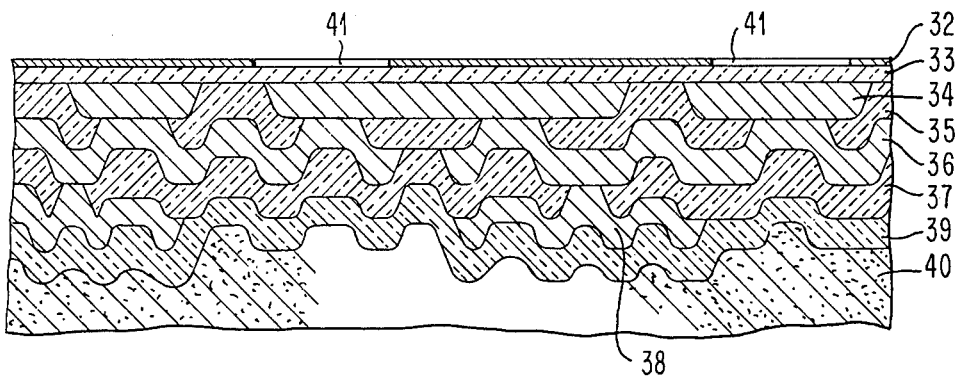
Figure 2E:
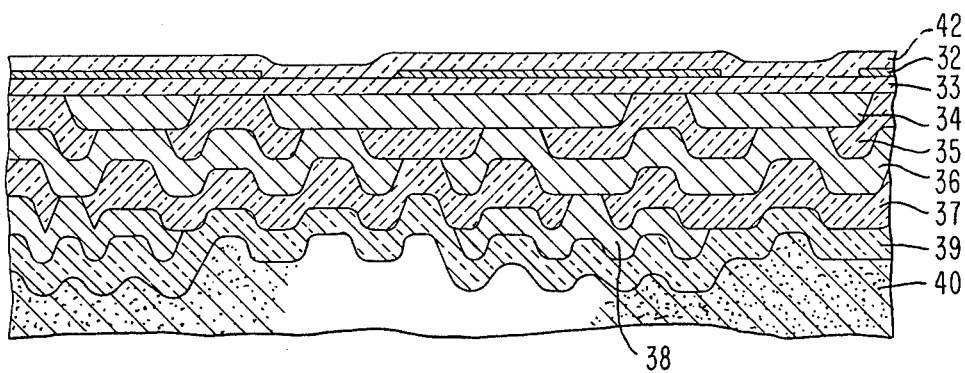
Figure 2F:
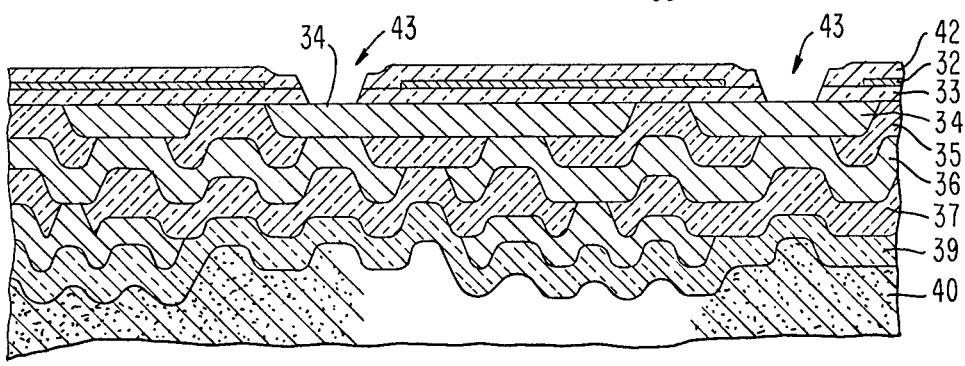

Then, FIG. 2D, apertures 41 having lateral dimensions greater than those of the via holes in the structure are formed through shield layer 32, after which a layer of silicon dioxide 42 having approximately the same thickness as silicon dioxide layer 33 is deposited over shield 32, FIG. 2E. Next, FIG. 2F, via holes 43 with smaller lateral dimensions than openings 41 are formed through silicon dioxide layers 42 and 33 within said openings. Thus, via holes 43 pass through the central composite structure formed by layers 33, 32 and 42 without contacting metallic layer 32 which will form the shield.

Next, an opposite level metallization pattern 44 is formed in the manner previously described. Portions 44A of this metallization pattern extend through via holes 43 into contact with first level metallization pattern 34, FIG. 2G. Then, utilizing the previously described techniques, additional opposite level metallization patterns 45 and 46 are formed as well as opposite covering layers 47, 48 and 49. The resulting structure has thick functional levels of metallization, three on each side of the central composite formed by silicon dioxide layers 33 and 42 and metallic shield 32.

Figure 2G:
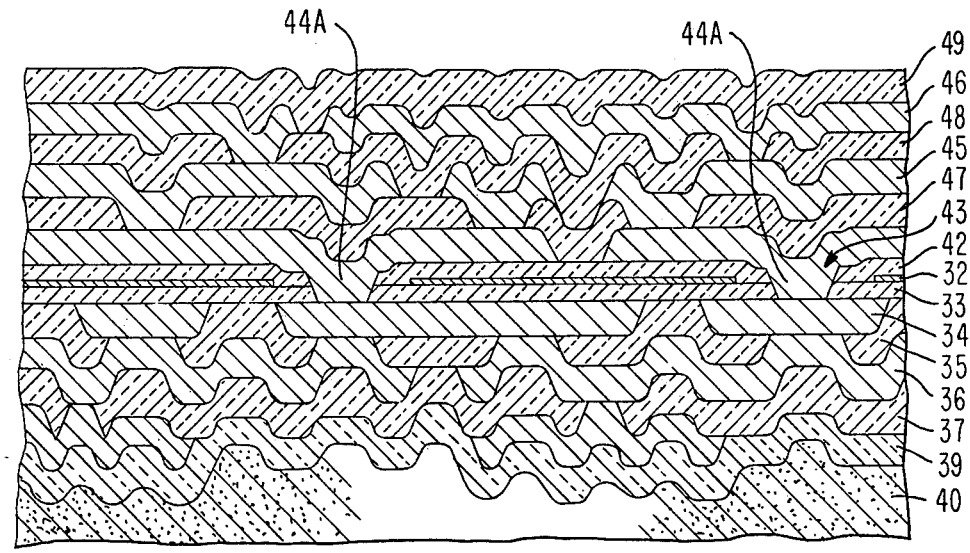

It should be noted that metallic shield 32 in the structure of FIG. 2G may function as a voltage distribution plane in addition to functioning as a metallic shield. In such a case, it is necessary to have a few via holes (not shown) from metallic layer 32 through silicon dioxide layer 42 to metallurgy pattern 44 and/or through silicon dioxide layer 33 to metallurgy pattern 34. Also, if additional conductive shields are desired, polycrystalline silicon support 40 may be appropriately doped as previously described and serve as an additional conductive shield. Where polycrystalline silicon layer 40 is doped, via holes (not shown) may be formed through adjoining covering layer 39 to provide a conductive path from polycrystalline material 40 to metallization pattern 38. In such a case, as has been previously described, the polycrystalline silicon support may also function as a voltage distribution plane. The structure of FIG. 2G may then provide a chip carrier with six levels of metallization patterns serving the function of chip interconnections plus two additional conductive layers, the metallic shield and the doped polycrystalline silicon support, functioning as voltage distribution planes to make a total of eight levels of conductive paths in the structure.

Solder reflow pads (not shown) may then be formed on the surface of covering dielectric layer 49 and chips may be joined to the chip carrier, FIG. 2G, by solder reflow in the manner previously described with respect to FIGS. 1M and 1N.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An integrated circuit chip carrier comprising
    an insulative layer of dielectric material having a first planar surface and an opposite planar surface
    a first level metallization pattern formed on said first planar surface,
    a first covering layer of dielectric material over said metallization pattern and said first surface, said first covering layer having elevated portions corresponding to said first metallization pattern,
    at least one additional level metallization pattern on said first covering layer,
    an additional covering layer of dielectric material over each additional level metallization pattern, said additional covering layer having elevated portions corresponding to the underlying metallization patterns, an opposite level metallization pattern formed on said opposite planar surface, an opposite covering layer of dielectric material over said opposite level metallization pattern and said opposite surface, said opposite covering layer having elevated portions corresponding to said opposite level metallization pattern, at least one additional opposite level metallization pattern on said opposite covering layer, an additional opposite covering layer of dielectric material over each additional opposite level metallization pattern, said additional opposite covering layer having elevated portions corresponding to underlying opposite level metallization patterns, and a base member forming an interface with the surface of said additional covering layer for supporting the carrier.

2. The integrated circuit carrier of claim 1 wherein said base is a layer of polycrystalline semiconductor material.

3. The integrated circuit chip carrier of claim 2 wherein at least one of the covering layers has a plurality of via holes formed therethrough and metal in said via holes forming conductive paths between the metallization patterns separated by said covering layer.

4. The integrated circuit chip carrier of claim 3 wherein at least one of the covering layers over the first planar surface and at least one of the covering layers over the opposite planar surface, each has a plurality of said via holes and said metallic conductive paths.

5. The integrated circuit chip carrier of claim 4 wherein said insulative layer has at least one via hole formed therethrough and metal in said via hole forms a conductive path between said first level and said opposite level metallization patterns.

6. The integrated circuit chip carrier of claim 5 wherein at least one of the via holes is coincident with a via hole through an underlying layer.

7. The integrated circuit chip carrier of claim 5 wherein said additional covering layer has a plurality of via holes formed therethrough to the underlying metallization pattern, and, said carrier further includes a plurality of solder pads having a lower melting point than said underlying metallization pattern on the surface of said additional covering layer conductively connected to said pattern through said via holes.

8. The carrier of claim 7 further including at least one integrated circuit chip having a plurality of solder pads corresponding to and bonded to the solder pads on the carrier by solder reflow joints.

9. The integrated circuit chip carrier of claim 5 wherein said supporting layer is polycrystalline silicon.

10. The chip carrier of claim 9 wherein said polycrystalline silicon layer is doped with conductivity-determining impurities to render it conductive, and the covering layer beneath said polycrystalline silicon layer has at least one via hole formed therethrough and polycrystalline silicon in said via hole forming a conductive path from said polycrystalline layer to the metallization pattern underlying said covering layer.

11. The integrated circuit chip carrier of claim 9 wherein said covering layers are of silicon dioxide.

12. The integrated circuit chip carrier of claim 11 wherein said insulative layer is silicon dioxide.

13. The integrated circuit chip carrier of claim 12 wherein said insulative layer is a composite comprising a silicon dioxide layer providing said first planar surface, a silicon dioxide layer providing said opposite planar surface and a metallic layer intermediate said silicon dioxide layers.

14. The integrated circuit chip carrier of claim 4 wherein said insulative layer and said opposite covering layer have formed therethrough at least one via hole passing through both of said layers and spaced from said opposite level metallization pattern and metal in said via hole forming a conductive path between said first level metallization pattern and the additional opposite level metallization pattern on said opposite covering layer.

* * * * *